(12) United States Patent
Takata et al.

(10) Patent No.: US 12,628,587 B2
(45) Date of Patent: May 12, 2026

(54) ETCHING METHOD AND ETCHING APPARATUS

(71) Applicant: Tokyo Electron Limited, Tokyo (JP)

(72) Inventors: Fumiya Takata, Miyagi (JP); Yusuke Takino, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 357 days.

(21) Appl. No.: 17/952,448

(22) Filed: Sep. 26, 2022

(65) Prior Publication Data

US 2023/0107264 A1 Apr. 6, 2023

(30) Foreign Application Priority Data

Sep. 27, 2021 (JP) ................................. 2021-156416

(51) Int. Cl.
  *H10P 50/20* (2026.01)
  *H10P 14/60* (2026.01)
  (Continued)

(52) U.S. Cl.
  CPC ........ H10P 50/244 (2026.01); H10P 14/6308 (2026.01); H10P 14/6319 (2026.01); H10P 14/69215 (2026.01); H10P 72/0418 (2026.01)

(58) Field of Classification Search
  CPC ......... H01L 21/3065–30655; H01L 21/02164; H01L 21/02236; H01L 21/02252; H01L 21/67063; H01L 21/02238; H01L 21/32137; H01L 21/32139; H01L 21/67069; H01J 37/3211; H01J 37/32165; H10P 50/244; H10P 14/6308; H10P 14/6319; H10P 14/69215; H10P 72/0418; H10P 14/6309; H10P 50/268; H10P 50/71; H10P 72/0421
See application file for complete search history.

(56) References Cited

U.S. PATENT DOCUMENTS 9,997,372 B2 * 6/2018 Briggs .............. H01J 37/32009
10,438,774 B2 * 10/2019 Hishinuma ....... H01L 21/32135
(Continued)

FOREIGN PATENT DOCUMENTS

JP    2000-299310 A    10/2000
JP    2015-037091 A    2/2015
(Continued)

*Primary Examiner* — Aiden Lee
(74) *Attorney, Agent, or Firm* — XSENSUS LLP

(57) ABSTRACT

An etching method according to one embodiment of the present disclosure includes step (a), step (b), step (c), step (d), and step (e). Step (a) provides a substrate that has a silicon-containing film which does not include oxygen and nitrogen, and a mask formed on the silicon-containing film. Step (b) etches the silicon-containing film with plasma generated from a first processing gas that includes a halogen-containing gas to form a recess portion. Step (c) forms an oxide film in the recess portion with plasma generated from a second processing gas that includes an oxygen-containing gas and a gas including carbon, hydrogen, and fluorine. Step (d) further etches the silicon-containing film with the plasma generated from the first processing gas after step (c). Step (e) repeatedly executes step (c) and step (d) a preset number of times.

19 Claims, 10 Drawing Sheets

(51) Int. Cl.
  *H10P 14/692*   (2026.01)
  *H10P 50/24*   (2026.01)
  *H10P 72/00*   (2026.01)

(56)      References Cited

U.S. PATENT DOCUMENTS

| | | | |
|---|---|---|---|
| 2007/0193973 A1* | 8/2007 | Kim | H01L 21/31116 |
| | | | 257/E21.252 |
| 2013/0115772 A1* | 5/2013 | Oishi | H01L 21/30655 |
| | | | 438/694 |
| 2016/0163556 A1* | 6/2016 | Briggs | H01L 21/31116 |
| | | | 156/345.24 |
| 2016/0211149 A1* | 7/2016 | Watanabe | H01L 21/30655 |
| 2021/0074550 A1* | 3/2021 | Shimizu | H01L 21/31144 |

FOREIGN PATENT DOCUMENTS

| | | | |
|---|---|---|---|
| JP | 2019-220508 A | 12/2019 | |
| WO | WO-2019239991 A1 * | 12/2019 | H01J 37/32082 |

\* cited by examiner

*FIG. 1*

| NUMBER OF TIMES | PROCESSING TIME (OXIDE FILM FORMATION) | PROCESSING TIME (ETCHING) |
|---|---|---|
| 1~4 | 10 SECONDS | 15 SECONDS |
| 5~40 | 10 SECONDS | 35 SECONDS |
| ... | ... | ... |

ETCHING METHOD AND ETCHING APPARATUS

CROSS-REFERENCE TO RELATED APPLICATIONS

This application is based on and claims priority from Japanese Patent Application No. 2021-156416, filed on Sep. 27, 2021 with the Japan Patent Office, the disclosure of which are incorporated herein in its entirety by reference.

TECHNICAL FIELD

The present disclosure relates to an etching method and an etching apparatus.

BACKGROUND

Conventionally, there is a technique of etching a silicon film of a substrate in which a silicon film and a pattern mask are stacked in order from a bottom with plasma generated from a halogen-containing gas (see Japanese Patent Laid-open Publication No. 2015-037091).

SUMMARY

An etching method according to one aspect of the present disclosure includes step (a), step (b), step (c), step (d), and step (e). Step (a) is a step of providing a substrate that has a silicon-containing film which does not include oxygen and nitrogen, and a mask formed on the silicon-containing film. Step (b) is a step of etching the silicon-containing film with plasma generated from a first processing gas that includes a halogen-containing gas to form a recess portion. Step (c) is a step of forming an oxide film in the recess portion with plasma generated from a second processing gas that includes an oxygen-containing gas and a gas including carbon, hydrogen, and fluorine. Step (d) is a step of further etching the silicon-containing film with the plasma generated from the first processing gas after step (c). Step (e) is a step of repeatedly executing step (c) and step (d) a preset number of times. In the etching method, in step (e), a thickness of the oxide film to be formed is changed by changing a processing condition of at least one of step (c) and step (d).

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF DRAWINGS

FIG. 1 is a flowchart illustrating an example of a flow of an etching method according to an embodiment.

DETAILED DESCRIPTION

Figure 2A:
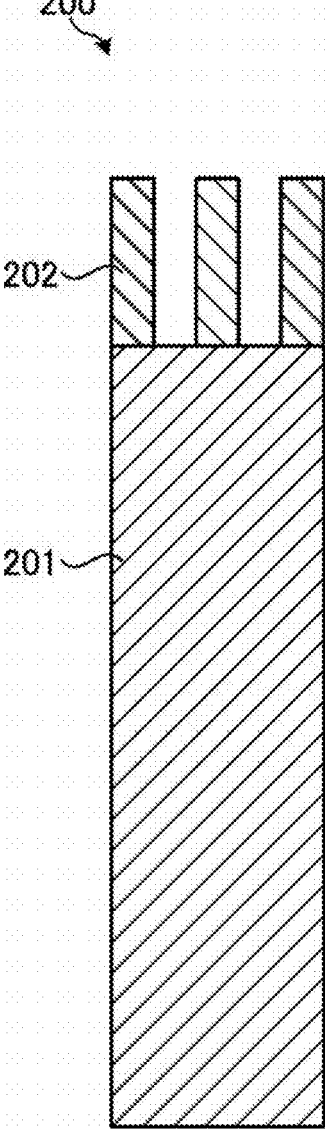
FIG. 2A is a view illustrating an example of a state of a substrate in each step of the etching method according to the embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, various exemplary embodiments will be described in detail with reference to the drawings. The disclosed technology is not limited to the following embodiments.

Hereinafter, in the description of the embodiments, when describing a direction of a pattern formed on a substrate, a direction substantially perpendicular to a substrate surface will be referred to as a thickness direction or a vertical direction. Further, a direction substantially parallel to the surface of the substrate will be referred to as a lateral direction. In a case where the substrate is substantially disk-shaped, a direction parallel to the substrate surface from a center of the disk toward a circumference will also be referred to as a radial direction.

In the following description, the term "pattern" refers to an overall shape formed on the substrate. The pattern refers to an entirety from a plurality of shapes by a hole, a trench, a line-and-space and a mask formed on the substrate. Further, the term "recess portion" refers to a portion having a shape recessed in the thickness direction of the substrate in the pattern formed on the substrate. Further, the recess portion has a "sidewall" that is an inner peripheral surface of a recessed shape, a "bottom portion" that is a bottom portion of the recessed shape, and a "top portion" that is a substrate surface in the vicinity of the sidewall, which is continuous with the sidewall. Further, a space surrounded by the corners of the top portion is referred to as an "opening". The term "opening" is also used to refer to an entire space or any position in the space surrounded by the bottom portion and the sidewall of the recess portion.

Incidentally, it is known that a shape abnormality occurs in the substrate when etching for forming the pattern having a high aspect ratio is performed. For example, when the recess portion is formed in the vertical direction, the shape abnormality may occur in which the inner peripheral surface of the recess portion swells in the lateral direction. Such a shape abnormality is called bowing.

On the other hand, in order to suppress the occurrence of the bowing, a method of forming a protective film on the sidewall of the recess portion has been proposed. As such a method, for example, there is a method of forming an oxide film that is the protective film on the sidewall of the recess portion by plasma generated from a processing gas that includes an oxygen-containing gas and a hydrofluorocarbon gas.

A position where the bowing occurs is often immediately below a position where the type of the film formed on the substrate changes. For example, in a case where a layer to be a mask at the time of etching is stacked on the silicon film that is an etching target, an etching rate is different between the mask and the silicon film. That is, an etching amount increases at a position where the mask is switched to the silicon film, and the opening swells in the lateral direction immediately below the mask, so that the bowing occurs with high possibility. The occurrence of the bowing causes deterioration of the vertical workability of the pattern formed by etching.

Therefore, a technique capable of improving the vertical workability of the pattern formed by etching is expected.
(Example of Flow of Etching Method According to Embodiment)

Figure 1:
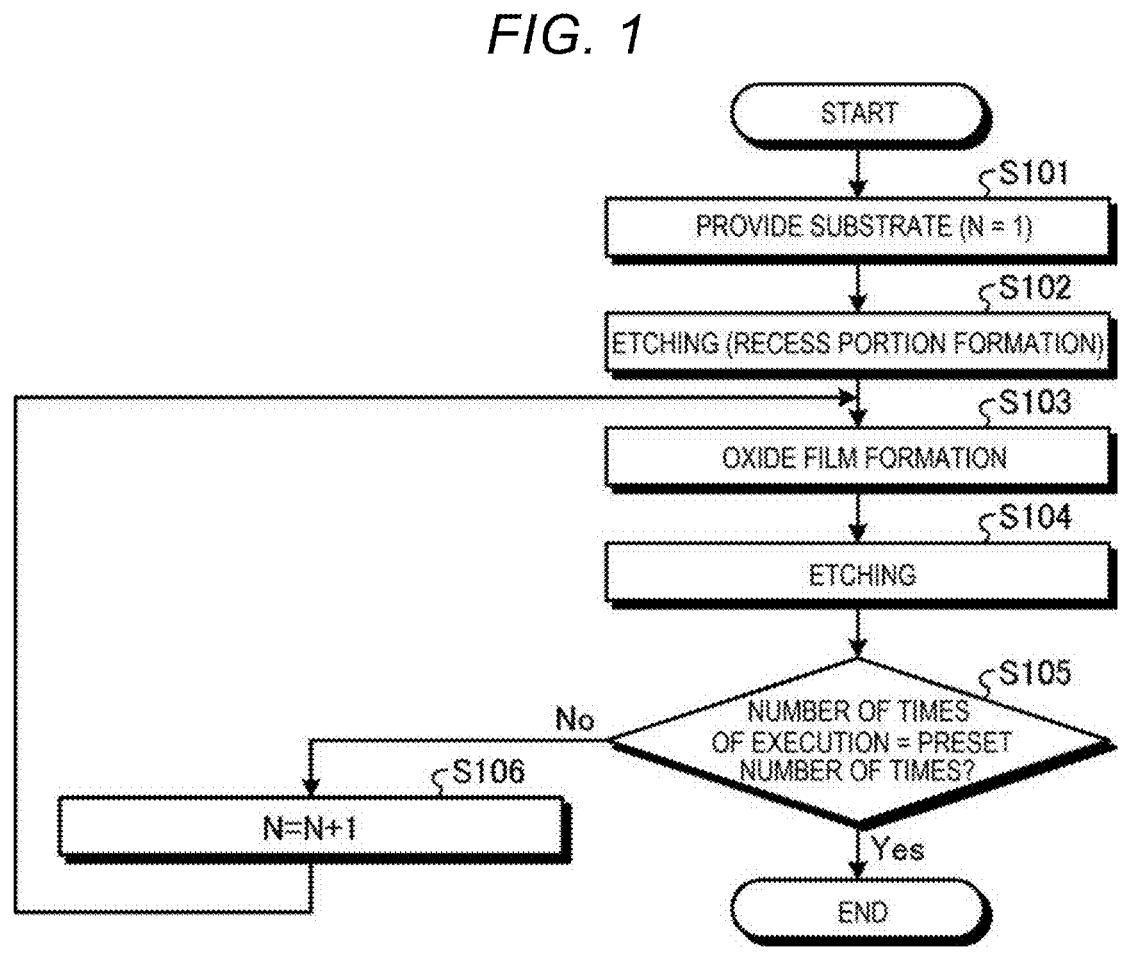

FIG. 1 is a flowchart illustrating an example of a flow of an etching method according to an embodiment. FIGS. 2A to 2E are views illustrating examples of the state of the substrate in each step of the etching method according to the embodiment.

First, a substrate 200 is provided (step S101, FIG. 2A). The substrate 200 has a plurality of stacked layers. For example, the substrate 200 includes a silicon-containing film 201 and a mask 202 formed on the silicon-containing film 201 (see FIG. 2A). The silicon-containing film 201 is a silicon-containing film that does not contain oxygen and nitrogen. The mask 202 is a film having a predetermined pattern. Processes are executed on the substrate 200 by a plurality number of times. In FIG. 1, the number of execution times of the process is indicated by "N", and is set to "N=1" at the start of the process.

Figure 2B:
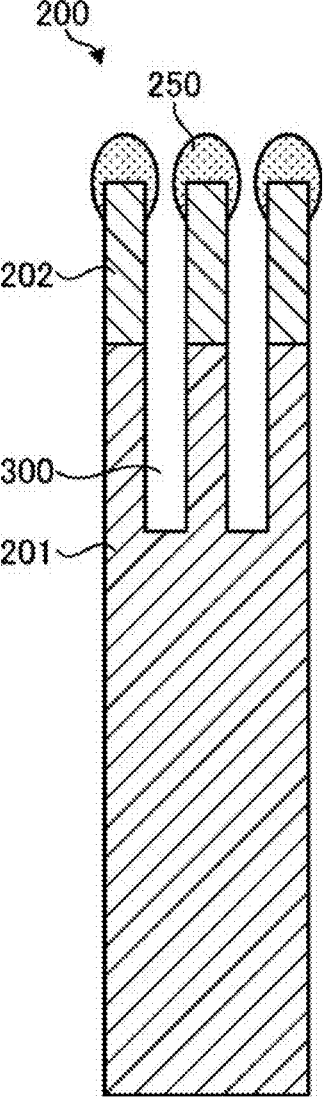
FIG. 2B is a view illustrating an example of the state of the substrate in each step of the etching method according to the embodiment.

Next, the silicon-containing film 201 is etched with plasma generated from a first processing gas that includes a halogen-containing gas (step S102, FIG. 2B). By etching, a pattern including a recess portion 300 is formed in the silicon-containing film 201. Further, in the process of forming the pattern on the substrate 200, by-products 250 generated by the etching adhere to the top portions of the pattern.

Figure 2C:
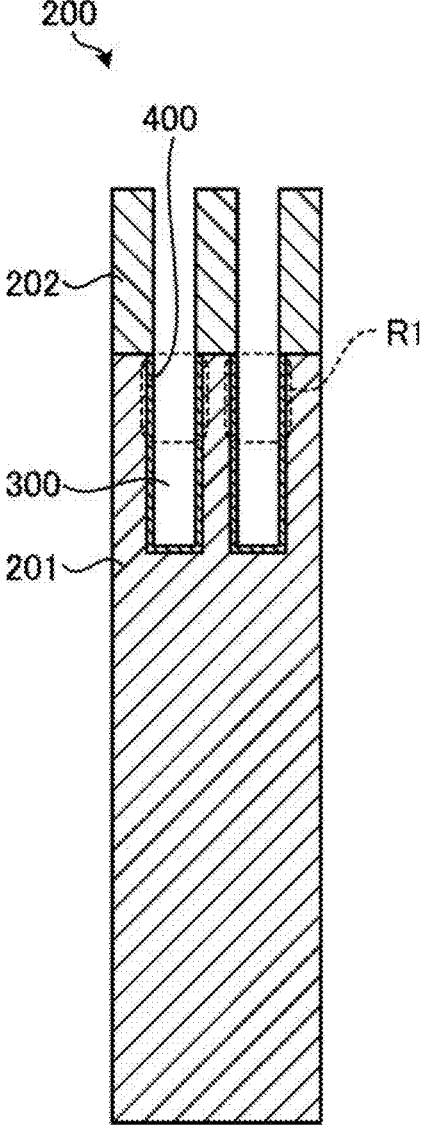
FIG. 2C is a view illustrating an example of the state of the substrate in each step of the etching method according to the embodiment.
Figure 2D:
FIG. 2D is a view illustrating an example of the state of the substrate in each step of the etching method according to the embodiment.
Figure 2D:
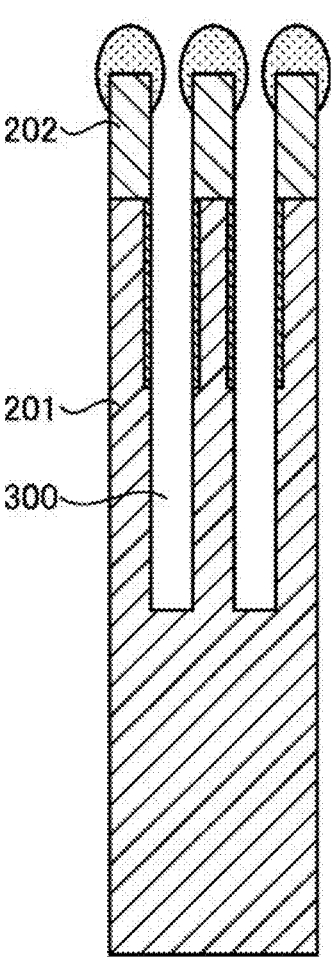

Next, an oxide film 400 that is a protective film is formed in the recess portion 300 with plasma generated from a second processing gas that includes an oxygen-containing gas and a gas including carbon, hydrogen, and fluorine (step S103, FIG. 2C). The oxide film 400 is formed to cover the bottom portion and the sidewall of the recess portion 300. Simultaneously with the formation of the oxide film 400, the by-product 250 is removed from the top portion of the pattern by a fluorine radical contained in the plasma generated from the second processing gas.

Figure 3:
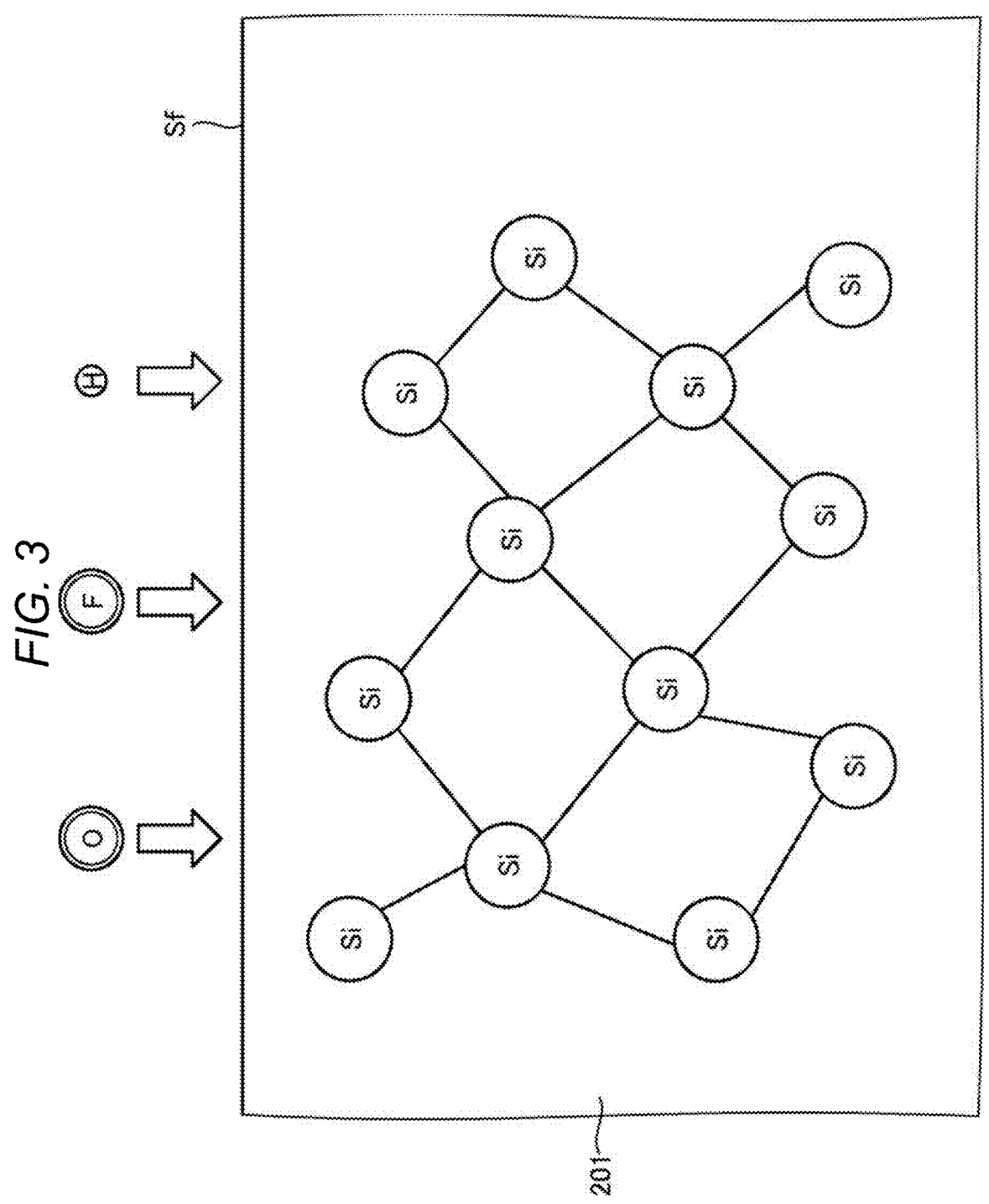
FIG. 3 is a view for explaining an example of an oxide film forming step.
Figure 4:
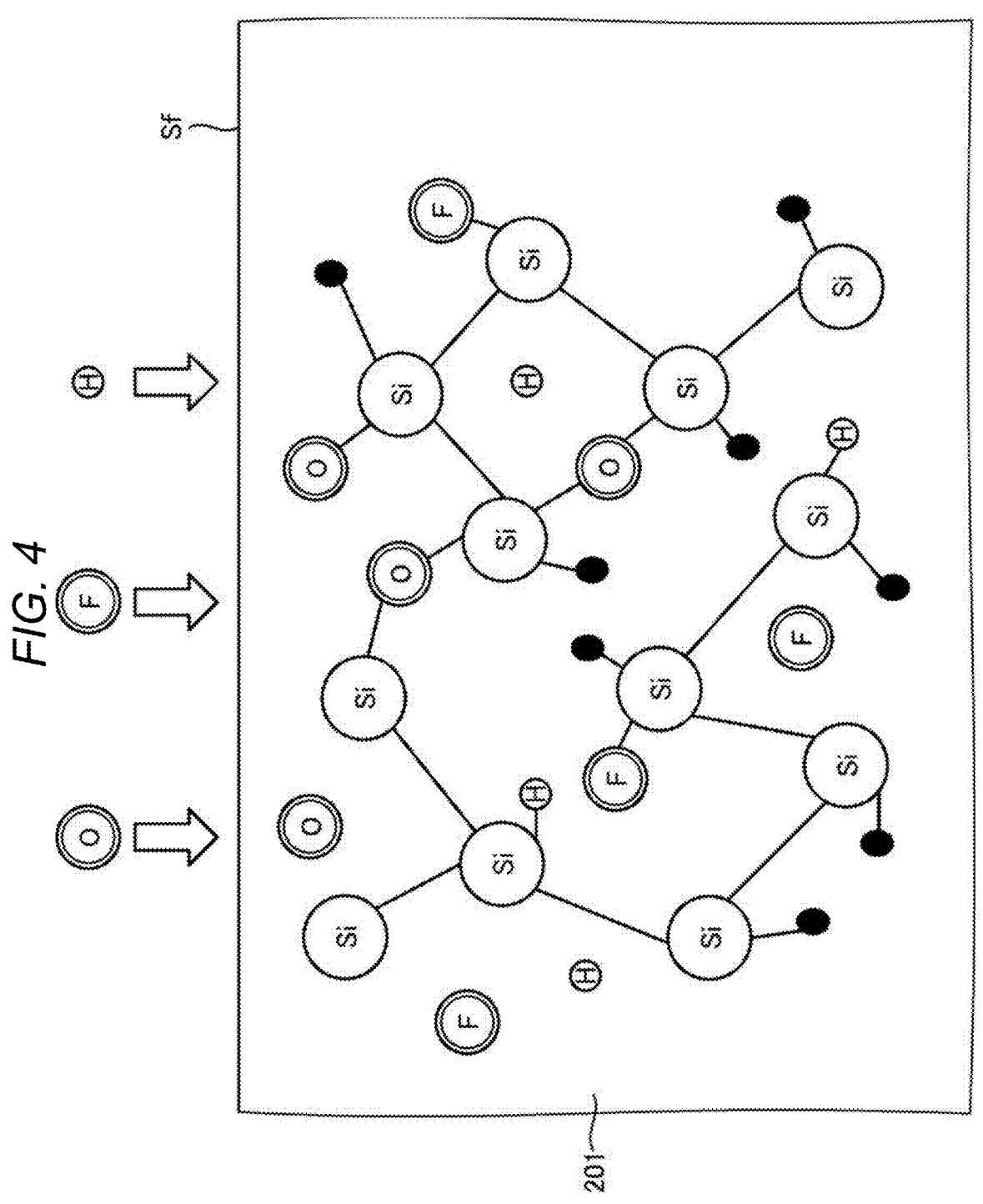
FIG. 4 is a view for explaining an example of the oxide film forming step.
Figure 5:
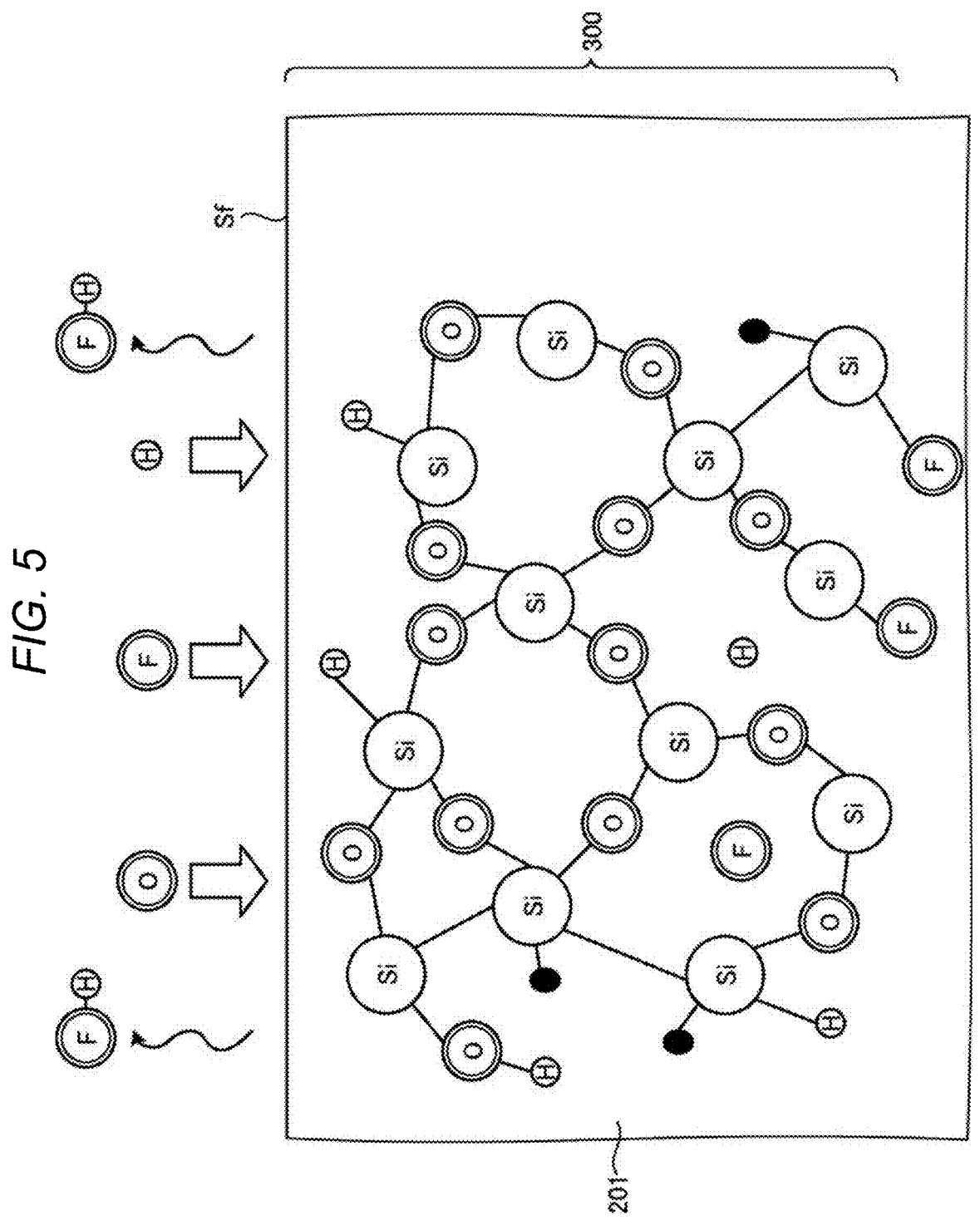
FIG. 5 is a view for explaining an example of the oxide film forming step.

Here, an example of a step of forming the oxide film 400 (step S103, FIG. 2C) will be described with reference to FIGS. 3 to 5. FIGS. 3 to 5 are views illustrating an example of the oxide film forming step. FIGS. 3 to 5 illustrate a surface Sf of the silicon-containing film 201 located inside the recess portion 300.

As illustrated in FIG. 3, the silicon-containing film 201 configures a crystal lattice of silicon made of Si—Si bonds. When the plasma generated from the second processing gas that includes the oxygen-containing gas and the gas including carbon, hydrogen, and fluorine is generated, the oxygen radical, the fluorine radical, and the hydrogen radical are dissociated from the oxygen-containing gas and the gas including carbon, hydrogen, and fluorine. The oxygen radical, the fluorine radical, and the hydrogen radical are adsorbed to the surface Sf of the silicon-containing film 201 located inside the recess portion 300.

Since an atomic radius of the fluorine radical is smaller than an inter-grid distance of the silicon crystal, the fluorine radical enters in the depth direction from the surface Sf. Since the fluorine radical has an electronegativity higher than that of the oxygen radical, when the fluorine radical is adsorbed on the surface Sf, electrons are extracted from the crystal lattice of silicon, and negative ions (F−) of fluorine are formed. The negative ion (F−) of fluorine enters the inside of the crystal lattice of silicon and reacts with the positively charged silicon. As a result, the negative ion (F−) of fluorine cuts the Si—Si bond to form a Si—F bond which is an ionic bond.

As illustrated in FIG. 4, the fluorine radical enters into the silicon-containing film 201 while forming an uncombined bond (dangling bond) of silicon and Si—F bonds. Then, oxygen, hydrogen, or fluorine is bonded to the uncombined bond of silicon. As a result, a Si—O bond, a Si—H bond, and a Si—F bond are formed.

The bond containing oxygen is stabilized by forming an O—Si—O bond. Fluorine in the surface layer inside the silicon-containing film 201 is bonded with hydrogen and removed as an HF gas, and a ratio of fluorine occupied in the surface layer of the silicon-containing film 201 is reduced. As a result, as illustrated in FIG. 5, a oxide film 400 with high-purity and high-quality containing silicon and oxygen as main components is formed on the surface layer (that is, the bottom portion and the sidewall of the recess portion 300) of the silicon-containing film 201. Further, in the step of forming the oxide film 400, the second processing gas includes not only the oxygen-containing gas but also the gas including carbon, hydrogen, and fluorine. Accordingly, in the step of forming the oxide film 400, the oxidation time can be shortened as compared with a case of forming the oxide film by using only the $O_2$ gas, and thus a total etching time can be shortened. As a result, the throughput can be improved.

Reference will be made again to FIGS. 1 and 2A to 2E. Next, the silicon-containing film 201 is further etched with the plasma generated from the first processing gas (step S104, FIG. 2D). The recess portion 300 becomes deeper due to further etching the silicon-containing film 201. By the etching, a portion of the oxide film 400 that covers the bottom portion of the recess portion 300 is removed, and a portion that covers the sidewall of the recess portion 300 remains.

Next, it is determined whether the number of times of execution reaches a preset number of times (step S105). When it is determined that the number of times of execution reaches the preset number of times (step S105, Yes), the process ends. When it is determined that the number of times of execution does not reach the preset number of times (step S105, No), the number of times of execution is updated (step S106, N=N+1), and the oxide film forming step (step S103) and the etching step (step S104) are executed again.

Figure 2E:
FIG. 2E is a view illustrating an example of the state of the substrate in each step of the etching method according to the embodiment.
Figure 2E:
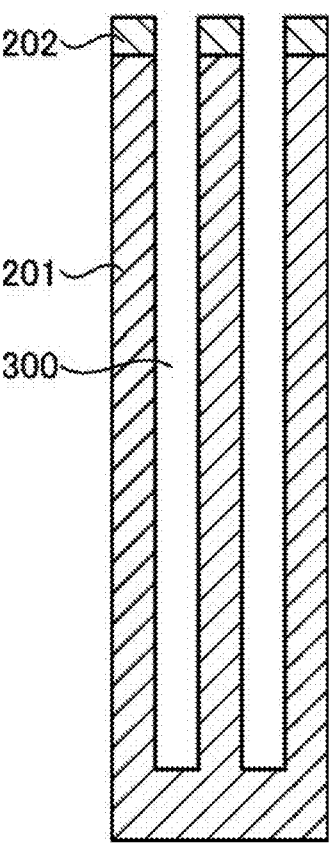

Thereafter, the processing from step S103 to step S104 is repeated until the number of times of execution reaches the preset number of times. When the number of times of execution reaches the preset number of times, the process ends. The shape illustrated in FIG. 2E is obtained by repeating of the oxide film forming step (step S103) and the etching step (step S104).

During the process of FIG. 1, the processing conditions for at least one of the oxide film forming step (step S103) and the etching step (step S104) to be repeatedly performed are changed such that the thickness of the oxide film 400 to be formed is changed. Specifically, the processing conditions of at least one of step S103 and step S104 are set such that the thickness of the oxide film 400 becomes maximum in a stage where the depth of the recess portion 300 is relatively shallow. Then, when the depth of the recess portion 300 reaches the predetermined value through the repetition of the etching, the processing conditions of at least one of step S103 and step S104 are changed such that the thickness of the oxide film 400 is reduced.

In the etching, bowing often occurs at the position where the mask 202 is switched to the silicon-containing film 201 (for example, the position indicated by RI in FIG. 2C). The position where the mask 202 is switched to the silicon-containing film 201 is located at the upper portion of the opening of the pattern that includes the recess portion 300. Therefore, in the etching method according to the embodiment, the occurrence of the bowing after the etching is suppressed by changing the processing conditions such that the thickness of the oxide film 400 becomes maximum in the stage where the depth of the recess portion 300 is relatively shallow. As a result, according to the etching method of the embodiment, it is possible to improve the vertical workability of the pattern formed by the etching.

The silicon-containing film 201 may be a silicon film, a silicon germanium film, a doped silicon film, or a stacked film including at least two films selected from the group consisting of these films. The doped silicon film may be a boron-doped silicon film or a phosphorus-doped silicon film.

The mask 202 may be a silicon oxide film, a silicon nitride film, or a silicon carbide film. The mask 202 may contain a metal such as tungsten (W), titanium (Ti), or hafnium (Hf).

Further, in the etching step of step S102 and step S104, as the halogen-containing gas contained in the first processing gas, at least one halogen-containing gas selected from the group consisting of a chlorine-containing gas and a bromine-containing gas can be used. As the chlorine-containing gas, at least one chlorine-containing gas selected from the group consisting of $Cl_2$, $SiCl_4$, and HCl can be used. As the bromine-containing gas, at least one bromine-containing gas selected from the group consisting of HBr and $Br_2$ can be used.

Further, in the oxide film forming step of step S103, as the oxygen-containing gas contained in the second processing gas, at least one oxygen-containing gas selected from the group consisting of $O_2$, CO, $CO_2$, and $SO_2$ can be used.

Further, in the oxide film forming step of step S103, as the gas including carbon, hydrogen, and fluorine, at least one type selected from the group of a mixed gas including $C_xH_yF_z$ (x, y, and z are natural numbers) gas, $C_xF_y$ (x and y are natural numbers) gas, and $H_2$ gas can be used. For example, as the gas including carbon, hydrogen, and fluorine, at least one type selected from the group consisting of $CH_3F$, $CH_2F_2$, and $CHF_3$ can be used. Further, for example, as the gas including carbon, hydrogen, and fluorine, a $CF_4$ gas and a $H_2$ gas can be used.

(Processing Conditions for Changing Thickness of Oxide Film)

As described above, in the etching method according to the embodiment, the thickness of the oxide film 400 to be formed is changed by repeating the etching until the depth of the recess portion 300 reaches a predetermined value. For example, the processing conditions are changed such that the thickness of the oxide film 400 becomes maximum in a stage where the depth of the recess portion 300 is relatively shallow.

As the processing conditions to be changed in order to realize such an etching method, for example, the following two processing conditions are given.

(1) Flow ratio of the oxygen-containing gas and the gas including carbon, hydrogen, and fluorine in the second processing gas (2) Ratio of the processing time of the oxide film forming step (step S103) to the processing time of the etching step (step S104)

First, as the processing condition, a case will be described in which the thickness of the oxide film 400 to be formed is changed by changing the flow ratio of the oxygen-containing gas and the gas including carbon, hydrogen, and fluorine in the second processing gas. The oxide film forming step (step S103) and the etching step (step S104) are repeatedly executed at least n (n is a natural number of 2 or more) times or more.

Then, in the oxide film forming step (step S103) up to an (n−1)th time, the flow ratio of the gas including carbon, hydrogen, and fluorine to the oxygen-containing gas is set to the maximum value. Thereafter, in the oxide film forming step (step S103) of the nth time and thereafter, the thickness of the oxide film 400 to be formed is changed (reduced) by changing the flow ratio of the gas that includes carbon, hydrogen, and fluorine to the oxygen-containing gas to a value lower than the maximum value. The flow ratio of the gas including carbon, hydrogen, and fluorine to the oxygen-containing gas is, for example, 0.3 or less.

In this way, when the flow ratio of the gas including carbon, hydrogen, and fluorine to the oxygen-containing gas is changed such that the thickness of the oxide film 400 becomes maximum in a stage where the depth of the recess portion 300 is relatively shallow, the oxide film 400 having the maximum thickness can be formed at a location where the bowing is easily generated.

Next, as the processing condition, a case will be described in which the thickness of the oxide film 400 to be formed is changed by changing the ratio of the processing time of the oxide film forming step (step S103) and the processing time of the etching step (step S104). The oxide film forming step (step S103) and the etching step (step S104) are repeatedly executed at least n (n is a natural number of 2 or more) times or more.

Then, in the oxide film forming step (step S103) and the etching step (step S104) up to an (n−1)th time, the ratio of the processing time of the etching step to the processing time of the oxide film forming step is set to the minimum value. Thereafter, in the oxide film forming step and the etching step of the nth time and thereafter, the thickness of the oxide film 400 to be formed is changed (reduced) by changing the ratio of the processing time of the etching step to the processing time of the oxide film forming step to a value higher than the minimum value. The ratio of the processing time of the etching step to the processing time of the oxide film forming step is, for example, 0.5 or more and 5.0 or less.

In this way, when the ratio of the processing time of the etching step to the processing time of the oxide film forming step is changed so as to maximize the thickness of the oxide film 400 in the stage where the depth of the recess portion 300 is relatively shallow, the oxide film 400 having the maximum thickness can be formed at a location where the bowing is apt to occur.

(Examples of Changes in Processing Conditions)

Figures 6, 7:
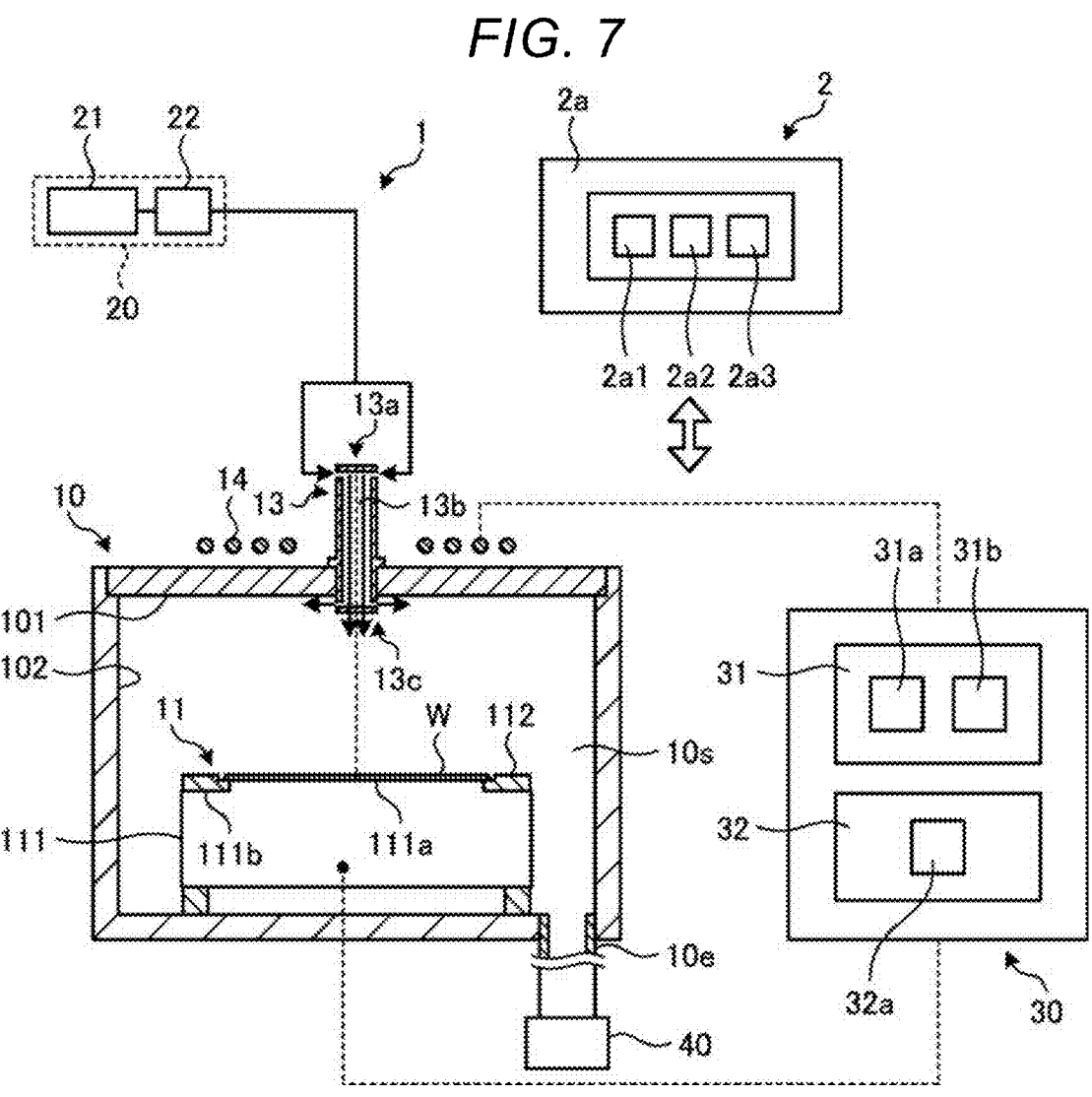
FIG. 6 is a diagram illustrating an example of conditions used in the etching method according to the embodiment.
FIG. 7 is a view illustrating an example of an etching apparatus according to an embodiment.

FIG. 6 is a diagram illustrating an example of conditions used in the etching method according to the embodiment. In the example of FIG. 6, as the conditions, "number of times", "processing time (oxide film formation)", and "processing time (etching)" are set. "Number of times" indicates the number of times of the process, that is, how many times the process is performed. "Processing time (oxide film formation)" indicates the processing time of the oxide film forming step (FIG. 1, step S103) in the corresponding number of times of the process. "Processing time (etching)" indicates the processing time of the etching step (FIG. 1, step S104) in the corresponding number of times of the process.

In the example of FIG. 6, when the number of times is 1 or more to 4 or less, the ratio of the processing time of the etching step to the processing time of the oxide film forming step is set to 1.5 (=15/10), which is the minimum value. Thereafter, when the number of times is 5 or more to 40 or less, the ratio of the processing time of the etching step to the processing time of the oxide film forming step is changed to 3.5 (=35/10) higher than the minimum value. The example of FIG. 6 is the following condition: the ratio of the processing time is set to the minimum value to maintain the thickness of the oxide film 400 to the maximum thickness until the depth of the recess portion 300 reaches a predetermined value due to the progressed process, and thereafter, the ratio of the processing time is reduced to reduce the thickness of the oxide film 400. The condition for the ratio of the processing time used in the etching method according to the embodiment is not particularly limited. For example, a condition may be used in which the ratio of the processing times is set to the minimum value until the process proceeds and the depth of the recess portion 300 reaches the predetermined value, and then the ratio of the processing times is gradually reduced.

(Configuration Example of Etching Apparatus According to Embodiment)

FIG. 7 is a view illustrating an example of an etching apparatus according to an embodiment. The etching apparatus illustrated in FIG. 7 is a plasma processing system. Hereinafter, an example of the configuration example of a plasma processing system will be described.

The plasma processing system includes an inductively coupled plasma processing apparatus (hereinafter, also referred to as a plasma processing apparatus) 1 and a controller 2. A plasma processing apparatus 1 includes a plasma processing chamber 10, a gas supply 20, a power source 30, and an exhaust system 40. The plasma processing chamber 10 includes a dielectric window 101. Further, the plasma processing apparatus 1 includes a substrate support 11, a gas introduction unit, and an antenna 14. The substrate support 11 is disposed in the plasma processing chamber 10. The antenna 14 is disposed on or above the plasma processing chamber 10 (that is, on or above the dielectric window 101). The plasma processing chamber 10 has a plasma processing space 10s defined by the dielectric window 101, the sidewall 102 of the plasma processing chamber 10, and the substrate support 11. The plasma processing chamber 10 has at least one gas supply port for supplying at least one processing gas into the plasma processing space 10s, and at least one gas exhaust port for exhausting the gas from the plasma processing space.

The substrate support 11 includes a main body 111 and a ring assembly 112. The main body 111 has a central region (substrate support surface) 111a for supporting the substrate (wafer) W, and an annular region (ring support surface) 111b for supporting the ring assembly 112. The annular region 111b of the main body 111 surrounds the central region 111a of the main body 111 in a plan view. The substrate W is disposed on the central region 111a of the main body 111 and the ring assembly 112 is disposed on the annular region 111b of the main body 111 to surround the substrate W on the central region 111a of the main body 111. In one embodiment, the main body 111 includes a base and an electrostatic chuck. The base includes a conductive member. The conductive member of the base functions as a lower electrode. The electrostatic chuck is disposed on the base. The upper surface of the electrostatic chuck has a substrate support surface 111a. The ring assembly 112 includes one or more annular members. At least one of the one or more annular members is an edge ring. Although not illustrated, the substrate support 11 may include a temperature control module configured to adjust at least one of the electrostatic chuck, the ring assembly 112, and the substrate to a target temperature. The temperature control module may include a heater, a heat transfer medium, a flow path, or a combination thereof. A heat transfer fluid, such as brine or gas, flows through the flow path. Further, the substrate support 11 may include a heat transfer gas supply configured to supply a heat transfer gas between the rear surface of the substrate W and the substrate support surface 111a.

The gas introduction unit is configured to introduce at least one processing gas from the gas supply 20 into the plasma processing space 10s. In one embodiment, the gas introduction unit includes a center gas injector (CGI) 13. The center gas injector 13 is disposed above the substrate support 11 and attached to a center opening formed in the dielectric window 101. The center gas injector 13 has at least one gas supply port 13a, at least one gas flow path 13b, and at least one gas introduction port 13c. The processing gas supplied to the gas supply port 13a passes through the gas flow path 13b and is introduced into the plasma processing space 10s from the gas introduction port 13c. The gas introduction unit may include one or more side gas injectors (SGI) attached to one or more openings formed in the sidewall 102, in addition to or instead of the center gas injector 13.

The gas supply 20 may include at least one gas source 21 and at least one flow rate controller 22. In one embodiment, the gas supply 20 is configured to supply at least one processing gas from the respective corresponding gas sources 21 to the center gas injector 13 via the respective corresponding flow rate controllers 22. Each flow rate controller 22 may include, for example, a mass flow controller or a pressure-controlled flow rate controller. Further, the gas supply 20 may include one or more flow rate modulation devices that modulate or pulse flow rates of at least one processing gas.

The power source 30 includes an RF power source 31 coupled to plasma processing chamber 10 via at least one impedance matching circuit. The RF power source 31 is configured to supply at least one RF signal (RF power), such as a source RF signal and a bias RF signal, to the conductive member of the substrate support 11 and the antenna 14. As a result, plasma is formed from at least one processing gas supplied into the plasma processing space 10s. Accordingly, the RF power source 31 may function as at least a portion of a plasma generator configured to generate plasma from one or more processing gases in the plasma processing chamber 10. Further, supplying the bias RF signal to the conductive member of the substrate support 11 can generate a bias potential in the substrate W to draw ions in the formed plasma to the substrate W.

In one embodiment, the RF power source 31 includes a first RF generator 31a and a second RF generator 31b. The first RF generator 31a is coupled to the antenna 14, and configured to generate the source RF signal (source RF power) for plasma generation via at least one impedance matching circuit. In one embodiment, the source RF signal has a frequency in the range of 13 MHz to 150 MHz. In one embodiment, the first RF generator 31*a* may be configured to generate a plurality of source RF signals having different frequencies. The generated one or more source RF signals are supplied to the antenna 14. The second RF generator 31*b* is coupled to the conductive member of the substrate support 11 via at least one impedance matching circuit, and configured to generate a bias RF signal (bias RF power). In one embodiment, the bias RF signal has a lower frequency than the source RF signal. In one embodiment, the bias RF signal has a frequency in the range of 400 kHz to 13.56 MHz. In one embodiment, the second RF generator 31*b* may be configured to generate a plurality of bias RF signals having different frequencies. The generated one or more bias RF signals are supplied to the conductive member of the substrate support 11. Further, in various embodiments, at least one of the source RF signal and the bias RF signal may be pulsed.

Further, the power source 30 may include a DC power source 32 coupled to the plasma processing chamber 10. The DC power source 32 includes a bias DC generator 32*a*. In one embodiment, the bias DC generator 32*a* is connected to the conductive member of the substrate support 11 and configured to generate the bias DC signal. The generated bias DC signal is applied to the conductive member of the substrate support 11. In one embodiment, the bias DC signal may be applied to another electrode, such as an electrode inside an electrostatic chuck. In various embodiments, the bias DC signal may be pulsed. The bias DC generator 32*a* may be provided in addition to the RF power source 31, or may be provided instead of the second RF generator 31*b*.

The antenna 14 includes one or more coils. In one embodiment, the antenna 14 may include an outer coil and an inner coil that are coaxially disposed. In this case, the RF power source 31 may be connected to both the outer coil and the inner coil, or may be connected to any one of the outer coil and the inner coil. In the former case, the same RF generator may be connected to both the outer coil and the inner coil, or separate RF generators may be connected to the outer coil and the inner coil, respectively.

The exhaust system 40 may be connected to, for example, a gas exhaust port 10*e* disposed at a bottom portion of the plasma processing chamber 10. The exhaust system 40 may include a pressure adjusting valve and a vacuum pump. The pressure in the plasma processing space 10*s* is adjusted by the pressure adjusting valve. The vacuum pump may include a turbo molecular pump, a dry pump, or a combination thereof.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include, for example, a computer 2*a*. For example, the computer 2*a* may include a processor (central processing unit (CPU)) 2*al*, a storage 2*a2*, and a communication interface 2*a3*. The processor 2*al* may be configured to perform various control operations based on a program stored in the storage 2*a2*. The storage 2*a2* may include a random access memory (RAM), a read only memory (ROM), a hard disk drive (HDD), a solid state drive (SSD), or a combination thereof. The communication interface 2*a3* may communicate with the plasma processing apparatus 1 via a communication line such as a local area network (LAN).

EFFECTS OF EMBODIMENTS

The etching method according to the embodiment described above includes step (a), step (b), step (c), step (d), and step (e). Step (a) is a step of providing the substrate (for example, the substrate 200) having a silicon-containing film (for example, the silicon-containing film 201) which does not include oxygen and nitrogen, and the mask (for example, the mask 202) formed on the silicon-containing film. Step (b) is a step of forming the recess portion (for example, the recess portion 300) by etching the silicon-containing film with the plasma generated from the first processing gas that includes the halogen-containing gas. Step (c) is a step of forming the oxide film (for example, the oxide film 400) in the recess portion by plasma generated from the second processing gas that includes the oxygen-containing gas and the gas including carbon, hydrogen, and fluorine. Step (d) is a step of further etching the silicon-containing film with the plasma generated from the first processing gas after step (c). Step (e) is a step of repeatedly executing step (c) and step (d) a preset number of times. In the etching method, in step (e), a thickness of the oxide film to be formed is changed by changing a processing condition of at least one of step (c) and step (d). As a result, according to the embodiment, it is possible to improve the vertical workability of the pattern formed by etching.

Further, in the etching method according to the embodiment described above, in step (e), the thickness of the oxide film to be formed may be changed by changing the flow ratio of the oxygen-containing gas and the gas including carbon, hydrogen, and fluorine in the second processing gas as the processing conditions. Accordingly, according to the embodiment, the thickness of the oxide film to be formed can be finely adjusted according to the depth of the recess portion that becomes deeper due to the repetition of the etching.

In addition, in the etching method according to the embodiment described above, in step (e), step (c) and step (d) may be repeated at least n (n is a natural number of 2 or more) times or more. Further, in the etching method, in step (c) up to an (n−1)th time, the flow ratio of the gas including carbon, hydrogen, and fluorine to the oxygen-containing gas may be set to the maximum value. Further, in the etching method, in step (c) of the nth time and thereafter, the thickness of the oxide film to be formed may be changed by changing the flow ratio to a value lower than the maximum value. Further, the flow ratio of the gas including carbon, hydrogen, and fluorine to the oxygen-containing gas may be 0.3 or less. As a result, according to the embodiment, it is possible to form the oxide film having the maximum thickness at a location where the bowing of the pattern easily occurs through etching.

Further, in the etching method according to the embodiment described above, in step (e), the thickness of the oxide film to be formed may be changed by changing the ratio of the processing time of step (c) and the processing time of step (d) as the processing condition. Accordingly, according to the embodiment, the thickness of the oxide film to be formed can be finely adjusted according to the depth of the recess portion that becomes deeper due to the repetition of the etching.

In addition, in the etching method according to the embodiment described above, in step (e), step (c) and step (d) may be repeated at least n (n is a natural number of 2 or more) times or more. Further, in the etching method according to the embodiment described above, in step (c) and step (d) up to the (n−1)th time, the ratio of the processing time of step (d) to the processing time of step (c) may be set to the minimum value. Further, in the etching method according to the embodiment described above, in step (c) and step (d) of the nth time and thereafter, the thickness of the oxide film to be formed may be changed by changing the ratio to a value higher than the minimum value. Further, the ratio of the processing time of step (d) to the processing time of step (c) may be 0.5 or more and 5.0 or less. As a result, according to the embodiment, it is possible to form the oxide film having the maximum thickness at a location where the bowing of the pattern easily occurs through etching.

Further, in the embodiment described above, the halogen-containing gas may be at least one halogen-containing gas selected from the group consisting of the chlorine-containing gas and the bromine-containing gas. Further, the chlorine-containing gas may be at least one chlorine-containing gas selected from the group consisting of $Cl_2$, $SiCl_4$, and HCl. Further, the bromine-containing gas may be at least one bromine-containing gas selected from the group consisting of HBr and $Br_2$. Further, the oxygen-containing gas may be at least one oxygen-containing gas selected from the group consisting of $O_2$, CO, $CO_2$, and $SO_2$. Further, the gas including carbon, hydrogen, and fluorine may be at least one type selected from the group of a mixed gas that includes the $C_xH_yF_z$ (x, y, and z are natural numbers) gas, and the $C_xF_y$ (x and y are natural numbers) gas, and the $H_2$ gas. Further, the gas including carbon, hydrogen, and fluorine may be at least one type selected from the group consisting of $CH_3F$, $CH_2F_2$, and $CHF_3$. Further, the gas including carbon, hydrogen, and fluorine may be the $CF_4$ gas or the $H_2$ gas. Further, the silicon-containing film may be a silicon film, a silicon germanium film, a doped silicon film, or a stacked film including at least two films selected from the group consisting of these films. Further, the doped silicon film may be the boron-doped silicon film or the phosphorus-doped silicon film. As a result, according to the embodiment, it is possible to improve the vertical workability of the patterns formed on various silicon-containing films on the substrate through etching. According to the present disclosure, it is possible to improve the vertical workability of the pattern formed by the etching.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. An etching apparatus comprising:
   a plasma processing chamber providing a processing space;
   a substrate support provided inside the plasma processing chamber and configured to support a substrate having a silicon-containing film that does not include oxygen and nitrogen;
   a gas supply configured to supply a processing gas into the plasma processing chamber; and
   a controller configured to control the plasma processing chamber, the substrate support and the gas supply to execute
   (a) providing the substrate that has a silicon-containing film that does not include oxygen and nitrogen, and a mask formed on the silicon-containing film, (b) etching the silicon-containing film with plasma generated from a first processing gas that includes a halogen-containing gas to form a recess portion,
   (c) forming an oxide film in the recess portion with plasma generated from a second processing gas that includes an oxygen-containing gas and a gas including carbon, hydrogen, and fluorine,
   (d) further etching the silicon-containing film with the plasma generated from the first processing gas after (c), and
   (e) repeatedly executing (c) and (d) a predetermined number of times,
   wherein in (e), a film thickness of the oxide film to be formed is changed by changing a flow ratio of the gas including carbon, hydrogen, and fluorine and the oxygen containing gas in the second processing gas as the processing condition, and
   wherein the predetermined number of times is at least n times or more (n is a natural number of 2 or more,
   in (c) up to an $(n-1)^{th}$ time, the flow ratio of the gas including carbon, hydrogen, and fluorine to the oxygen-containing gas is set to a maximum value, and
   in (c) of an $n^{th}$ time and thereafter, the thickness of the oxide film to be formed is changed by changing the flow ratio to a value lower than the maximum value.

2. The etching apparatus according to claim 1, wherein the flow ratio of the gas including carbon, hydrogen, and fluorine to the oxygen-containing gas is 0.3 or less.

3. An etching apparatus comprising:
   a plasma processing chamber providing a processing space;
   a substrate support provided inside the plasma processing chamber and configured to support a substrate having a silicon-containing film that does not include oxygen and nitrogen;
   a gas supply configured to supply a processing gas into the plasma processing chamber; and
   a controller configured to control the plasma processing chamber, the substrate support and the gas supply to execute
   (a) providing the substrate that has a silicon-containing film that does not include oxygen and nitrogen, and a mask formed on the silicon-containing film,
   (b) etching the silicon-containing film with plasma generated from a first processing gas that includes a halogen-containing gas to form a recess portion,
   (c) forming an oxide film in the recess portion with plasma generated from a second processing gas that includes an oxygen-containing gas and a gas including carbon, hydrogen, and fluorine,
   (d) further etching the silicon-containing film with the plasma generated from the first processing gas after (c), and
   (e) repeatedly executing (c) and (d) a predetermined number of times,
   wherein in (e), a film thickness of the oxide film to be formed is changed by changing a ratio of a processing time of (d) and a processing time of (c) as the processing condition, and
   wherein the predetermined number of times is at least n times or more (n is a natural number of 2 or more,
   in (c) and (d) up to an $(n-1)^{th}$ time, the ratio of the processing time of (d) to the processing time of (c) is set to a minimum value, and
   in (c) and (d) of an $n^{th}$ time and thereafter, the thickness of the oxide film to be formed is changed by changing the ratio to a value higher than the minimum value.

4. The etching apparatus according to claim 1, wherein the halogen-containing gas is at least one member selected from the group consisting of a chlorine-containing gas and a bromine-containing gas.

5. The etching apparatus according to claim 1, wherein the halogen-containing gas is at least one chlorine-containing gas selected from the group consisting of $Cl_2$, $SiCl_4$, and HCl.

6. The etching apparatus according to claim 1, wherein the halogen-containing gas is at least one bromine-containing gas selected from the group consisting of HBr and $Br_2$.

7. The etching apparatus according to claim 1, wherein the oxygen-containing gas is at least one oxygen-containing gas selected from the group consisting of $O_2$, CO, $CO_2$, and $SO_2$.

8. The etching apparatus according to claim 1, wherein the gas including carbon, hydrogen, and fluorine is at least one type selected from the group of a mixed gas including a $C_xH_yF_z$ (x, y, and z are natural numbers) gas, a $C_xF_y$ (x and y are natural numbers) gas, and a $H_2$ gas.

9. The etching apparatus according to claim 1, wherein the gas including carbon, hydrogen, and fluorine is at least one type selected from the group consisting of $CH_3F$, $CH_2F_2$, and $CHF_3$.

10. The etching apparatus according to claim 1, wherein the gas including carbon, hydrogen, and fluorine is a $CF_4$ gas and a $H_2$ gas.

11. The etching apparatus according to claim 3, wherein the ratio of the processing time of (d) to the processing time of (c) is 0.5 or more and 5.0 or less.

12. The etching apparatus according to claim 1, wherein the value lower than the maximum value is less than 0.3.

13. The etching apparatus according to claim 3, wherein the halogen-containing gas is at least one member selected from the group consisting of a chlorine-containing gas and a bromine-containing gas.

14. The etching apparatus according to claim 3, wherein the halogen-containing gas is at least one chlorine-containing gas selected from the group consisting of Ck, $SiCl_4$, and HCl.

15. The etching apparatus according to claim 3, wherein the halogen-containing gas is at least one bromine-containing gas selected from the group consisting of HBr and $Br_2$.

16. The etching apparatus according to claim 3, wherein the oxygen-containing gas is at least one oxygen-containing gas selected from the group consisting of $O_2$, CO, $CO_2$, and $SO_2$.

17. The etching apparatus according to claim 3, wherein the gas including carbon, hydrogen, and fluorine is at least one type selected from the group of a mixed gas including a $C_xH_yF_z$ (x, y, and z are natural numbers) gas, a $C_xF_y$ (x and y are natural numbers) gas, and a $H_2$ gas.

18. The etching apparatus according to claim 3, wherein the gas including carbon, hydrogen, and fluorine is at least one type selected from the group consisting of $CH_3F$, $CH_2F_2$, and $CHF_3$.

19. The etching apparatus according to claim 3, wherein the gas including carbon, hydrogen, and fluorine is a $CF_4$ gas and a $H_2$ gas.

* * * * *